United States Patent [19]
Marek

[11] 3,800,190

[45] Mar. 26, 1974

[54] COOLING SYSTEM FOR POWER SEMICONDUCTOR DEVICES

[75] Inventor: Alois Marek, Nussbaumen, Switzerland

[73] Assignee: BBC Brown, Boveri & Company, Limited, Baden, Switzerland

[22] Filed: May 25, 1973

[21] Appl. No.: 364,043

Related U.S. Application Data

[63] Continuation of Ser. No. 194,404, Nov. 1, 1971, abandoned.

[30] Foreign Application Priority Data

Nov. 2, 1970 Switzerland........................ 16185/70

[52] U.S. Cl....... 317/234 R, 317/234 A, 317/234 B, 174/15, 165/80, 165/105

[51] Int. Cl............................. H01l 3/00, H01l 5/00

[58] Field of Search................ 317/234, 1, 1.5, 3, 4, 317/4.1, 5.4; 165/80, 105; 174/15

[56] References Cited

UNITED STATES PATENTS

| | | | |
|---|---|---|---|
| 3,491,272 | 1/1970 | Huth et al. | 317/235 |
| 3,590,346 | 6/1971 | Bilo | 317/235 |
| 3,653,433 | 4/1972 | Schari | 317/234 |
| 3,654,528 | 4/1972 | Barkan | 317/234 |

FOREIGN PATENTS OR APPLICATIONS

| | | | |
|---|---|---|---|
| 758,524 | 10/1956 | Great Britain | 317/234 |
| 914,034 | 12/1962 | Great Britain | 317/234 |
| 1,348,742 | 12/1963 | France | 317/234 |

OTHER PUBLICATIONS

IBM Technical Disclosure Bulletin, by Chu, Vol. 12, No. 3, August, 1969, p. 379.

"The Heat Pipe;" by Feldman et al., Mechanical Engineering, pp. 30 to 33, February, 1967.

*Primary Examiner*—Andrew J. James
*Attorney, Agent, or Firm*—W. G. Fasse

[57] ABSTRACT

Efficient cooling is facilitated in the present power semiconductor arrangement by means of thin surface contact layers which, on the one side, are in area contact with the current conducting surfaces of a semiconductor body and, on the opposite side, in heat transfer contact with a coolant and in electrical contact with the main terminals. The coolant may be circulated, for example, by the coaction of gravity and convection, or by so called heat pipe techniques. The contact layers are relatively thin and are made of materials having a good electrical and thermal conductivity. Preferably, the main terminals contact said surface contact layers above those semiconductor regions, where the smaller part of dissipation energy originates, whereas the coolant contacts said surface contact layers above those semiconductor regions, where the main part of dissipation energy originates during the current conducting state of the semiconductor element.

16 Claims, 3 Drawing Figures

COOLING SYSTEM FOR POWER SEMICONDUCTOR DEVICES

This is a continuation of application Ser. No. 194,404 filed Nov. 1, 1971 and now abandoned.

BACKGROUND OF THE INVENTION

The present invention relates to a power semiconductor arrangement especially with cooling by evaporation. It is well known that in a power semiconductor device, for example, the silicon disk must be arranged in thermal contact with a heat sink in order to remove the heat produced during the operation. This is especially so since the heat capacity of the silicon disk is rather small.

Providing said thermal contact between the silicon disk and a heat sink has posed substantial problems heretofore, because materials having a good heat conductivity such as copper have a temperature expansion coefficient which is substantially different from that of silicon. Therefore, it has been customary heretofore to contact the silicon disk in view of the unavoidable temperature differences, with a thick metal layer having about the same temperature expansion coefficient, for example, molybdenum or tungsten. This metal layer was then soldered to a substantial copper electrode as for example disclosed in "Brown, Boveri Mitteilungen," No. 53, 1966, p. 628 and 629. It is also known to contact the metal layer with the silicon disk by means of a chucking device which maintains the silicon disk and the metal layer under pressure contact as disclosed for example by "Scientia Electria," Vol. XII, No. 4, 1966, p. 117. However, the molybdenum or tungsten layers constitute substantial thermal resistances.

Another publication "New Scientist," Mar. 7, 1970, p. 461 discloses the cooling of electronic circuit elements by so called heat pipe techniques, whereby heat is removed through the vaporization of a liquid which is recirculated through the capillary action of layers constructed with the necessary capillary ducts. However, even in this technique, there are substantial thermal resistances between the heat source and the cooling means. As a matter of fact such thermal resistance may be especially large where an electrically insulating ceramic layer is arranged between the housing of the electronic circuit element and the cooling means, as disclosed in German Pat. Publication No. 1,514,551.

The just described thermal resistances in prior art devices result in substantial temperature differences within such devices and impose severe limitations with regard to the amount of heat which may be removed. These temperature differences and limitations have resulted in the well known technical difficulties which resulted in a shorter life or in a limited power output of prior art semiconductor devices.

OBJECTS OF THE INVENTION

In view of the foregoing, it is the aim of the invention to achieve the following objects, singly or in combination:

to overcome the outlined drawbacks of the prior art, especially to avoid temperature differences within the semicondcutor arrangement and to avoid limitiations as to the amount of heat which may be removed;

to improve the useful life of semiconductor power devices as well as their power rating;

to arrange the cooling means in such a manner that they may be directly effective in those areas where most of the heat to be dissipated is generated;

to arrange the heat transfer means in such a manner that the heat transfer resistance between the semiconductor body and the cooling means is substantially reduced;

to reduce the thermal and mechanical strain to which power semiconductor arrangements have been subjected heretofore;

to predetermine the operating temperature of semiconductor power devices by selecting a coolant having a respective vaporization point; and to provide surface contact layers which have a defined ohmic contact and provide a good wetting by the coolant.

SUMMARY OF THE INVENTION

According to the invention, there is provided a power semiconductor device or arrangement, wherein each of the main current conducting surfaces of a semiconductor element or body is provided with a thin, electrically and thermically well conducting surface contact layer which is in heat transfer contact with a coolant at least in those areas in register with regions in the semiconductor body where during current conduction most of the heat loss is generated.

According to a further preferred embodiment of the invention, the electrical main terminals of the semiconductor arrangement contact the surface contact layers in areas which are in register with further regions of the semiconductor body in which during current conduction, the generation of heat loss is rather small as contrasted to the above mentioned regions of high heat loss generation.

It has been found that in semiconductor junction structures the heat loss is generated mostly just in the space or region of the semiconductor element where the recombination of the charge carriers takes place. Accordingly, in thyristors or so called pin-diodes the heat loss is generated in the region of the junction between the two outer zones which region extends to a depth of about 10 to 50 microns and in parallel to the two surfaces which conduct the main current. The invention now teaches to bring the coolant into direct contact with the surface areas through which the heat loss flows and to connect the electrical terminals with those portions or regions of the surface contact layer where in the respective semiconductor portion very little lost heat is generated whereby an electrically nonconducting or rather poorly conducting coolant is employed. This feature of the invention has the advantage that thermal resistances between the semiconductor body and the coolant are substantially reduced, whereby a rather substantial amount of heat may be removed. As a result, the semiconductor arrangement may be operated at a large power rating while simultaneously its rated temperature will be maintained. Further, temperature gradients within the semiconductor body itself will be minimized whereby an extended useful life is accomplished due to the fact that thermal-mechanical stresses are avoided or at least substantially reduced.

According to the invention, the regions in which the largest proportion of heat loss is generated in the semiconductor body may be predetermined in their location by giving the semiconductor body a suitable geometrical shape or by means of a suitable doping. Moreover, the surface contact layers need to be only as thick as is necessary for assuring a sufficiently small transversal electrical resistance. Thus, if the surface contact layer is made for example of a good conductor such as silver, copper or gold, a satisfactorily small transversal resistance is achieved for thicknesses in the range of about 100 microns.

BRIEF FIGURE DESCRIPTION

In order that the invention may be clearly understood, it will now be described, by way of example, with reference to the accompanying drawing, wherein.

DETAILED DESCRIPTION OF PREFERRED EMBODIMENTS

Figure 1:
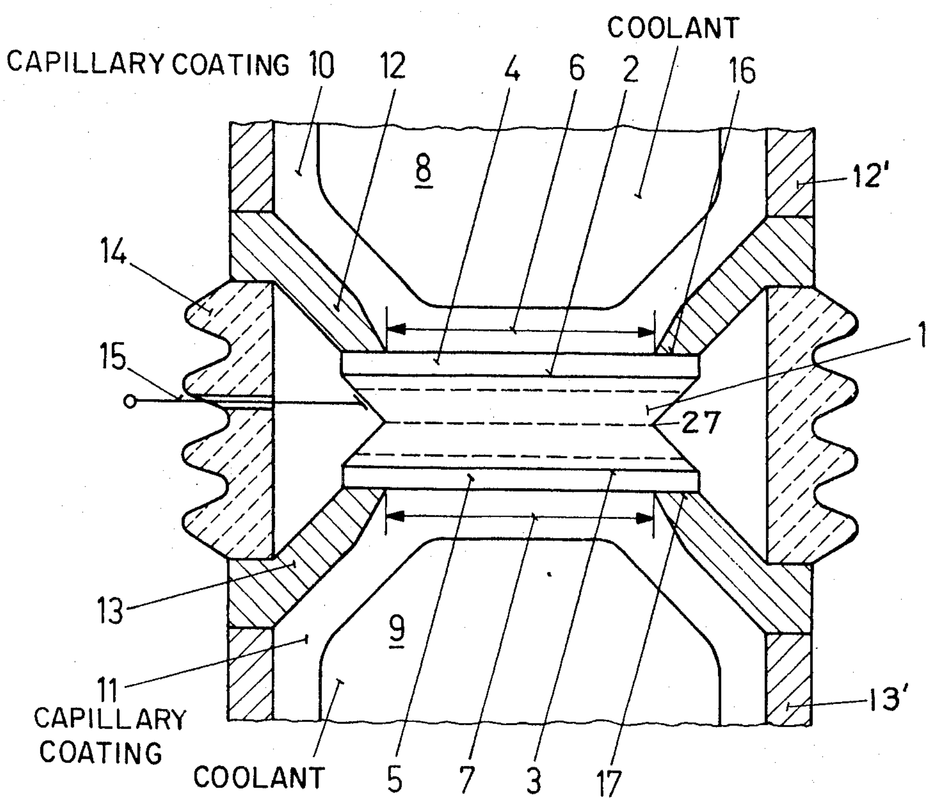
FIG. 1 is a sectional view through a semiconductor arrangement embodiment in which the circulation of a coolant is accomplished by means of a capillary structure.

FIG. 1 illustrates a four layer semiconductor element 1, such as a thyristor, having surfaces 2 and 3 which contact the main current. According to the invention, metallic surface contact layers 4 and 5 are placed in contact wtih said surfaces 2 and 3. The surface contact layers 4 and 5 are made of a metal which is a good electrical and thermal conductor, for example, silver, copper or gold.

The circumference of the semiconductor element 1 is provided with a V-groove extending all around the element 1. This geometrical configuration divides the semiconductor element substantially into two portions or regions. Namely, one cylindrical central region and a surrounding annular region having a depth substantially corresponding to the depth of the V-groove. This configuration assures that the main proportion of the heat loss is generated just beneath the surfaces 2 and 3 of the central region in the areas 6 and 7 which, according to the invention, are cooled by a coolant in the spaces 8 and 9 formed by the main electrodes 12 and 13 as well as by mechanical connecting means 12′ and 13′. The inner surfaces of these spaces 8 and 9 are provided with a respective capillary layer 10 and 11 which may be made, for example, of a capillary tungsten deposit from a tungsten volatilized phase. The capillary structure assures the circulation of the coolant which thus comes into direct contact with the areas 6 and 7 where the most heat loss is generated. Due to the recirculation of the coolant, in accordance with the heat pipe principle, the cooling is essential independent of gravitational forces.

The annular ring portions 16 and 17 of the surface contact layers 4 and 5, which surround the surface areas 6 and 7 of these layers 4 and 5 are connected to the main electrodes or terminals 12 and 13 which simultaneously serve as mechanical mounting means in cooperation with said means 12′ and 13′. The connection between said annular areas or rings 16 and 17 on the one hand, and the main terminals 12 and 13 may be accomplished, for example, by soldering or by pressure contact means.

It has been found that in the peripheral regions of the semiconductor element 1, underneath the ring portions 16 and 17, practically no heat loss is generated because due to the geometric structure of the semiconductor element, the current is substantially restricted to the central region in register with said areas 6 and 7.

The main terminals 12 and 13 are separated from each other by an annular insulator 14. A control electrode 15 is connected to the semiconductor element 1 and extends, for example, outwardly through the insulator 14.

If the charge carrier recombination takes place in a layer having a thickness of about 50 microns adjacent to the surfaces 2 and 3, thermal resistance outwardly will be about 0.65 degrees per kilowatt whereby it is assumed that the semiconductor element or wafer 1 has a diameter of about 25 mm. A surface contact layer made of silver and having a diameter of 25 mm and a thickness of 130 microns has a heat resistance of 0.58 degrees per kilowatt. The electrical transversal resistance of such a silver layer is about $10^{-4}$ ohm. A structure according to FIG. 1 and having the just mentioned dimensions may, for example, by cooled by water at a temperature of 175° C. In this instance, about 750 watts in terms of thermal power will be removed from each of the surfaces 2 and 3. If water is replaced by another coolant, for example, methyl alcohol at a temperature of 100° C, the resulting heat removal from each surface 2 and 3 is 430 watts.

It follows from the just described examples, that the temperature inside the semiconductor element 1 is only a few degrees above the temperature of the cooled surfaces of the so called heat pipe comprising said capillary coating 10 in direct contact with the surface areas 6 and 7.

Figure 2:
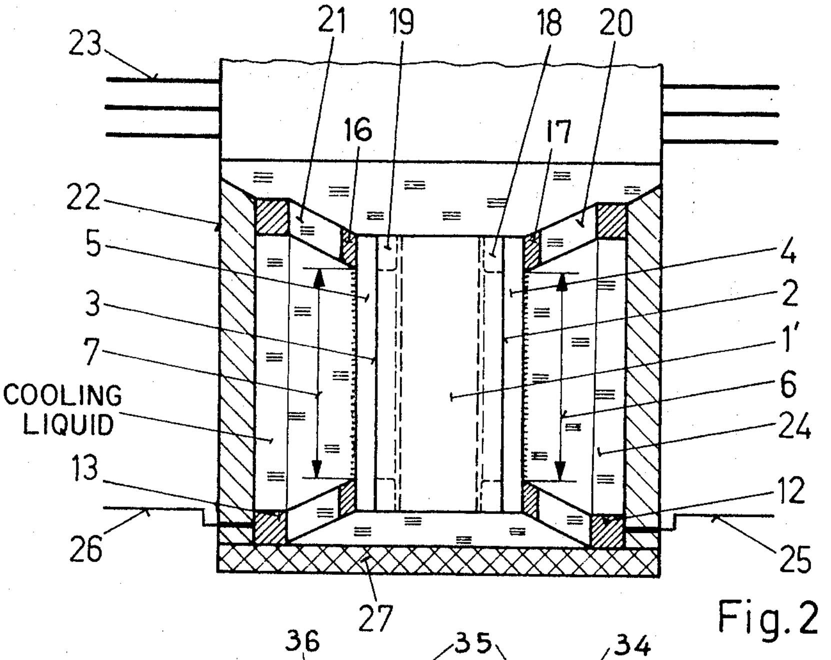
FIG. 2 illustrates an arrangement similar to that of FIG. 1, however, the coolant is circulated by a combination of gravitational and convection forces.

FIG. 2 is an arrangement in which the coolant circulation is accomplished by a combination of gravitational and conventional forces. The semiconductor body 1′ is again a cylindrical body just as in FIG. 1. However, the rotational axis now extends horizontally whereas in FIG. 1, it extended vertically. The semiconductor element 1′ may, for example, by a so called pin-diode, that is a diode having a first outer zone with a *p*-conductivity type and a second outer zone with a *n*-conductivity type as well as a highly resistive inner zone, preferably of some intrinsic conductivity. Here again, the surfaces 2 and 3 conduct the main current and, according to the invention, are in contact with metallic surface contact layers 4 and 5 made of a good electric and thermal conductor such as copper. The semiconductor body 1′ is supported in a housing 22 by means of two cup shaped members constituting the electrical terminal means 12 and 13. The bottom rings of these cup shaped members contact respective ring shaped portions 16 and 17 surrounding the central areas 6 and 7 of the surface contact layers 4 and 5. These rings 16 and 17 are in turn in contact with respective annular zones 18 and 19 of the semiconductor element 1, which is doped in these zones 18 and 19 to a lesser degree as compared to the doping in the remainder of the semiconductor body adjacent to its surfaces 2 and 3. By these different dopings, the same purpose is achieved as by the groove 27 in FIG. 1, namely, the semiconductor body is divided into a central region and into an outer region whereby the current lines are urged out of said annular ring zones 18 and 19 and into the central region. As a result, the main heat loss is generated in the region directly in register with the surface areas 6 and 7.

Instead of doping the annular zones 18 and 19 to a lesser extent, it is also possible to dope these zones with doping materials having a compensating effect and an opposite polarity.

The surface areas 6 and 7 of the contact layers 4 and 5 are in direct contact with a liquid coolant 24 contained in the housing 22. The above mentioned supporting cup members constituting the electrical main electrodes 12 and 13 are provided with lateral apertures 20 and 21 through which the coolant 24 may freely pass. The upper end of the container 22 is provided with cooling fins 23. The cup shaped terminal and supporting means 12 and 13 are connected to lead in wires 25, 26 through the walls of the housing, which walls are conducting and insulated from each other. The housing 22 is further closed at its lower end by an insulating bottom plate 27.

When the device according to FIG. 2 is in its conducting state and subject to a load, the liquid coolant 24 will be evapoarted along the surface contact layers 4 and 5 in the surface areas 6 and 7. Preferably, the liquid coolant has a surface tension which is rather small relative to its vapor phase. This has the advantage that the formation of large coherent bubbles along the surfaces 6 and 7 to be cooled, is prevented and that the heat can be removed with even greater speeds. In order to avoid any boiling delay, the surface contact layers 4 and 5 have a roughened surface within the areas 6 and 7 as shown.

In operation, rather small vapor bubbles formed along the areas 6 and 7 effervesce upwardly through the apertures 20 and 21 where the bubbles are condensed on the walls of the upper end of the housing 22 in the range of the cooling fins 23. The condensate then flows downwardly again and into the liquid coolant 24.

Figure 3:
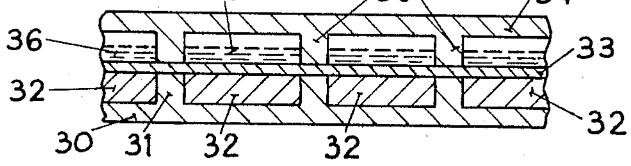
FIG. 3 is a partial sectional view of a further embodiment with a thyristor with emitter shortings in which the coolant is brought into direct contact with a surface contact layer above the sorting areas.

The present invention is especially suitable for the cooling of thyristors having so called emitter shorting areas, see for example "Brown, Boveri Mitteilungen," No. 53, 1966, p. 616. As mentioned, the main heat loss is generated in such thyristors in the region of the emitter zones. According to the present invention, these emitter zones are brought into direct contact with the cooling means via a thin contact surface layer. This embodiment of the invention is shown in FIG. 3 illustrating a partial sectional view through a thyristor wherein a base zone 30 of a semiconductor wafer of one conductivity type reaches with its emitter shortings 31 through an emitter zone 32 of an opposite conductivity type and thus into contact with a surface contact layer 33 which corresponds to the respective layers 4 and 5 in FIG. 1 or 2, respectively. A main contact or terminal member is provided with contact ribs 35 arranged in such positions that they register with zones in the surface contact layer 33 which in turn are in contact with said shorting areas 31. The space between adjacent contact ribs 35 contains a coolant 36. This arrangement applies the coolant where it is needed most and thus uses it rather efficiently. The remaining areas of the contact layer 33 that is, the areas in contact with the shorting areas 31, may thus be formed as electrical terminals or are thus available for connection to electrical terminals, and if desired, to mechanical mounting means.

In order to avoid boiling delays, the liquid coolant may have solid particles suspended therein. In any event, the operating temperature of the semicondcutor device may now be precisely predetermined by selecting a liquid coolant to be vaporized which has the respective vaporizing temperature. Where the operating temperature is sufficient to vaporize metals such as Hg, Cs, Na, K, Li or the like, these may be used as the coolant. In these instances, the electrical main terminals do not necessarily have to be connected to the surface contact layers but may simply be immersed into the coolant. In these instances, the surface contact areas are formed in such a manner that they assure a defined ohmic contact as well as a good wetting by the coolant. These surface contact areas may, for example, be formed by metal layers alloyed to the surfaces 2 and 3 or the surface contact areas may be formed by surface layers with a maximum doping for forming degenerated junctions.

However, in the embodiment of FIG. 2, the liquid coolant must be an electrical insulator in order not to short circuit the terminals 12 and 13. Suitable liquid coolants whch are simultaneously electrical insulators are, for example, fluorinated organic compounds, such as a compound sold by the Minnesota Mining and Manufacturing Company under the tradename "FC 77." In this instance, additional circuit elements to be cooled may be placed into the liquid coolant, for example, additional diodes, thyristors, or trigger elements, which may be interconnected in a circuit arrangement with the element 1.

The above mentioned electrically conducting liquid coolants which may be employed in the embodiment according to FIG. 1 may comprise, in addition to the mentioned metals which vaporize at the operating temperature of the semiconductor device, water, ammonia, or alcohols.

The removal of heat energy may further be improved by employing thermally dissociable liquid coolents, such as $NH_4$. For example, there is a strong binding among the components of the system $H_2O/NH_3$ which binding may be cracked only by means of high heat consumption.

Further, liquid coolant mixtures may be used instead of the chemical compounds, especially azeatropic liquid coolants may be employed. As is known in connection with the heat pipe technique, inert gases, such as argon or nitrogen, may be present in the spaces containing the liquid coolant, whereby the temperature of the surface to be cooled is stabilized for a wide range of heat currents. Where the coolant has solid particles suspended therein, such particles may, for example, comprise ceramic powders, comminuted glass or the like.

Although the invention has been described with reference to specific example embodiments, it is to be understood, that it is intended to cover all modifications and equivalents within the scope of the appended claims.

What is claimed is:

1. A power semiconductor arrangement, comprising a semiconducting material having a body portion of a high dissipating heat generation during current conduction as well as main current conducting surfaces, a thin layer of electrically and thermally conducting material in surface contact with each of said main current conducting surfaces, main electrical terminal means, a further body portion of lower dissipating heat generation in said semiconductor device having surfaces that constitute extensions of said main surfaces whereby said thin layers also contact said surfaces of said further body portion, means for connecting said electrical terminal means to each of said thin layers in areas in register with said further semiconductor body portion, and fluid cooling means arranged in direct heat exchanging contact with each of said thin layers at least in contact areas adjacent to and in register with said semiconductor body portion wherein during current conduction most of the heat loss is generated, said semiconducting material having a geometrical configuration for defining said body portion and said further body portion, the geometrical configuration of said semiconducting material comprising annular groove means extending laterally around the body in a peripheral zone thereof, said thin surface contact layers having annular regions in register with said groove means, and wherein said main electrical terminal means comprises annular members in contact with said annular regions of said thin layers.

2. The power semiconductor arrangement according to claim 1, wherein said thin surface contact layers have such a thickness as to provide a sufficiently small transversal electrical resistance in said thin layers.

3. The power semiconductor arrangement according to claim 2, wherein said thickness of the thin layer is about 100 microns.

4. The power semiconductor arrangement according to claim 1, wherein said fluid cooling means comprise coolant containing means, a coolant in said containing means, said coolant comprising an electrically conducting liquid having a vaporizing temperature corresponding to the operating temperature of said semiconductor device.

5. The power semiconductor arrangement according to claim 1, wherein said fluid cooling means comprise a coating with a capillary structure on said thin surface layers, said cooling means comprising a coolant circulated by said capillary structure to return the coolant to said contact areas in register with said semiconductor body portion generating said high heat.

6. The power semiconductor arrangement according to claim 1, wherein said main electrical contact means further comprise a configuration suitable for mechanical mounting of the semiconductor arrangement.

7. The power semiconductor arrangement according to claim 1, wherein said thin contact layers have a roughened surface in said areas whereby the formation of vapor bubbles on said surface is facilitated.

8. The power semiconductor arrangement according to claim 1, wherein said cooling means comprise a liquid coolant and solid materials in suspension in said liquid coolant whereby the formation of vapor bubbles is facilitated.

9. The power semiconductor arrangement according to claim 1, wherein said cooling means comprise a liquid coolant which is an electrical insulator.

10. The power semiconductor arrangement according to claim 1, wherein said cooling means comprise a liquid coolant which is subject to dissociation at the operating temperatures of the semiconductor device.

11. The power semiconductor arrangement according to claim 1, wherein said cooling means comprise a liquid coolant having a small surface tension relative to its vapor phase.

12. The power semiconductor arrangement according to claim 1, wherein said cooling means comprise a liquid coolant which is a mixture, especially an azeotropic mixture.

13. The power semiconductor arrangement according to claim 5, wherein said cooling means comprise a coolant, a chamber for containing said coolant, and an inert gas in said chamber.

14. In the power semiconductor arrangement according to claim 1, wherein said semiconductor device to be cooled is a thyristor having first and second base zones and first and second emitter zones, said first base zone reaching through predetermined areas of said first emitter zone to provide corresponding shorting areas, the improvement comprising main terminal means including ridges having a configuration corresponding to said shorting areas, said ridges contacting said thin surface contact layer in register with said shorting means, and valleys between said ridges in register with said emitter zone, said cooling means comprising a coolant in said valleys in direct contact with said thin surface contact layer where it is in register with said emitter zone.

15. A power semiconductor arrangement, comprising a semiconducting material having a body portion of high dissipating heat generation during current conduction as well as main current conducting surfaces, a thin layer of electrically and thermally conducting material in surface contact with each of said main current conducting surfaces, main electrical terminal means, a further body portion of lower disspitating heat generation in said semiconductor device having surfaces that constitute extensions of said main surfaces whereby said thin layers also contact said surfaces of said further body portion, means for connecting said electrical terminal means to each of said thin layers in areas in register with said further semiconductor body portion, and fluid cooling means arranged in direct heat exchanging contact with each of said thin layers at least in contact areas adjacent to and in register with said semiconductor body portion wherein during current conduction most of the heat loss is generated said portion of high heat generation in said semiconducting material being defined by a suitable doping of the semiconducting material of said body portion, whereby said contact areas are also defined as to their location in register with said portion, said arrangement further comprising main electrical terminal means, said main current conducting surfaces of said semiconducting material comprising a region which is doped to a lesser extent than the part of said semiconducting material adjacent to said region, and means for contacting said lesser dope region and said main electrical terminal means with each other.

16. A power semiconductor arrangement, comprising a semiconducting material having a body portion of high dissipating heat generation during current conduction as well as main current conducting surfaces, a thin layer of electrically and thermally conducting material in surface contact with each of said main current conducting surfaces, main electrical terminal means, a further body portion of lower dissipating heat generation in said semiconductor device having surfaces that constitute extensions of said main surfaces whereby said thin layers also contact said surfaces of said further body portion, means for connecting said electrical terminal means to each of said thin layers in areas in register with said further semiconductor body portion, and fluid cooling means arranged in direct heat exchanging contact with each of said thin layers at least in contact areas adjacent to and in register with said semiconductor body portion wherein during current conduction most of the heat loss is generated, said portion of high heat generation in said semiconducting material being defined by a suitable doping of the semiconducting material of said body portion, whereby said contact areas are also defined as to their location in register with said portion, said arrangement further comprising main electrical terminal means, said main current conducting surfaces of said semiconducting material comprising a region which is doped inversely as the part of said semiconducting material adjacent to said region, and means for contacting said inversely doped region and said main electrical terminal means with each other.

* * * * *